United States Patent [19]
Lur et al.

[11] Patent Number: 5,516,369
[45] Date of Patent: May 14, 1996

[54] METHOD AND APPARATUS FOR PARTICLE REDUCTION FROM SEMICONDUCTOR WAFERS

[75] Inventors: Water Lur, Taipei; Yu-Min Dang, Tao-Yuan, both of Taiwan

[73] Assignee: United Microelectronics Corporation, Hsinchu, Taiwan

[21] Appl. No.: 238,876

[22] Filed: May 6, 1994

[51] Int. Cl.$^6$ ................................................. B08B 6/00
[52] U.S. Cl. .......................... 134/1.3; 134/902; 15/1.51; 437/946
[58] Field of Search ................................ 134/1, 1.3, 902; 15/1.51; 437/946; 156/643

[56] References Cited

U.S. PATENT DOCUMENTS

| | | | |
|---|---|---|---|
| 5,024,968 | 6/1991 | Engelsberg | 437/173 |
| 5,125,124 | 6/1992 | Saeki et al. | 15/1.51 |
| 5,147,465 | 9/1992 | Muruyama et al. | 134/1 |
| 5,151,135 | 9/1992 | Magee et al. | 134/1 |
| 5,164,093 | 11/1992 | Chilton et al. | 210/688 |
| 5,308,791 | 5/1994 | Horiike et al. | 437/173 |

OTHER PUBLICATIONS

Ozawa et al, *Japanese Patent Abstracts*, No. 01–42134, Jun. 1989.

*Primary Examiner*—Donald E. Czaja
*Assistant Examiner*—Sean Vincent
*Attorney, Agent, or Firm*—George O. Saile; Rosemary L. S. Pike

[57] ABSTRACT

A method of removing particles from the surface of an integrated circuit is achieved by means of a cleaning device and method to remove particles from the surface of a semiconductor wafer. The cleaning device comprises a clean chamber wherein the semiconductor wafer is irradiated by electron flux whereby an electric repulsive force between the wafer surface and the particles will remove the particles from the wafer surface. The device further comprises a neutralization chamber wherein the semiconductor wafer is neutralized to prevent new particles from being attracted to the cleaned surface of the semiconductor wafer. A vacuum system is connected to the clean chamber and the neutralization chamber wherein the vacuum system will carry away the particles removed from the semiconductor wafer surface within the clean chamber.

16 Claims, 2 Drawing Sheets

5,516,369

METHOD AND APPARATUS FOR PARTICLE REDUCTION FROM SEMICONDUCTOR WAFERS

BACKGROUND OF THE INVENTION

1. Field of the Invention

The invention relates to the fabrication of integrated circuit devices, and more particularly, to a method of removing particles contaminating the surface of integrated circuit devices.

2. Description of the Prior Art

Defect reduction is one of the major issues for the fabrication of high-yield very large scale integrated circuit (VLSI) devices with feature sizes in the sub-micrometer range. Many cleaning processes, including wet chemical and vapor dry etching, have been adopted in the fabrication to reduce particles on wafers. However, no process has been able to clean wafers to be particle-free up to now.

The sources of particles on wafers are the ambient, the wafer holder, chemical solutions, de-ionized water, other wafer cross-contamination, machines, process reactions, etc. Most of the particles are attracted to the wafer surface by means of van der Waal's forces or by adsorption. If these particles remain on the wafer surface, it is difficult to remove them after films are deposited thereon.

A number of patents have addressed the unwanted particle issue. U.S. Pat. No. 5,164,093 to Chilton et al describes a method and a device for removing particles from circulating fluids, which fluids are then used to clean the wafer. U.S. Pat. No. 5,151,135 to Magee et al uses short, low-energy pulses of ultraviolet laser radiation to break bonds and to fragment and vaporize particles on the wafer's surface. U.S. Pat. No. 5,024,968 to Engelsberg teaches pulsed laser irradiation during inert gas flow to clean surfaces of contaminants.

SUMMARY OF THE INVENTION

A principal object of the present invention is to provide an effective and very manufacturable method of removing particles from the surface of an integrated circuit.

In accordance with the object of this invention a new method of removing particles from the surface of an integrated circuit is achieved by means of a new cleaning device and method to remove particles from the surface of a semiconductor wafer. The cleaning device comprises a clean chamber wherein the semiconductor wafer is irradiated by electron flux whereby an electric repulsive force between the wafer surface and the particles will remove the particles from the wafer surface. The device further comprises a neutralization chamber wherein the semiconductor wafer is neutralized to prevent new particles from being attracted to the cleaned surface of the semiconductor wafer. A vacuum system is connected to the clean chamber and the neutralization chamber wherein the vacuum system will carry away the particles removed from the semiconductor wafer surface within the clean chamber. BRIEF DESCRIPTION OF THE DRAWINGS In the accompanying drawings forming a material part of this description, there is shown:

FIGS. 1A and 1B schematically illustrate in cross-sectional representation two configurations of the cleaning device of the present invention.

FIG. 2 schematically illustrates in cross-sectional representation an electron gun configuration of the present invention.

FIG. 3 schematically illustrates in cross-sectional representation a hydrogen gun configuration of the present invention.

FIG. 4 graphically illustrates the electrostatic and van der Waal's interaction energy related to the separation distance between particles.

DESCRIPTION OF THE PREFERRED EMBODIMENTS

Figure 1A:
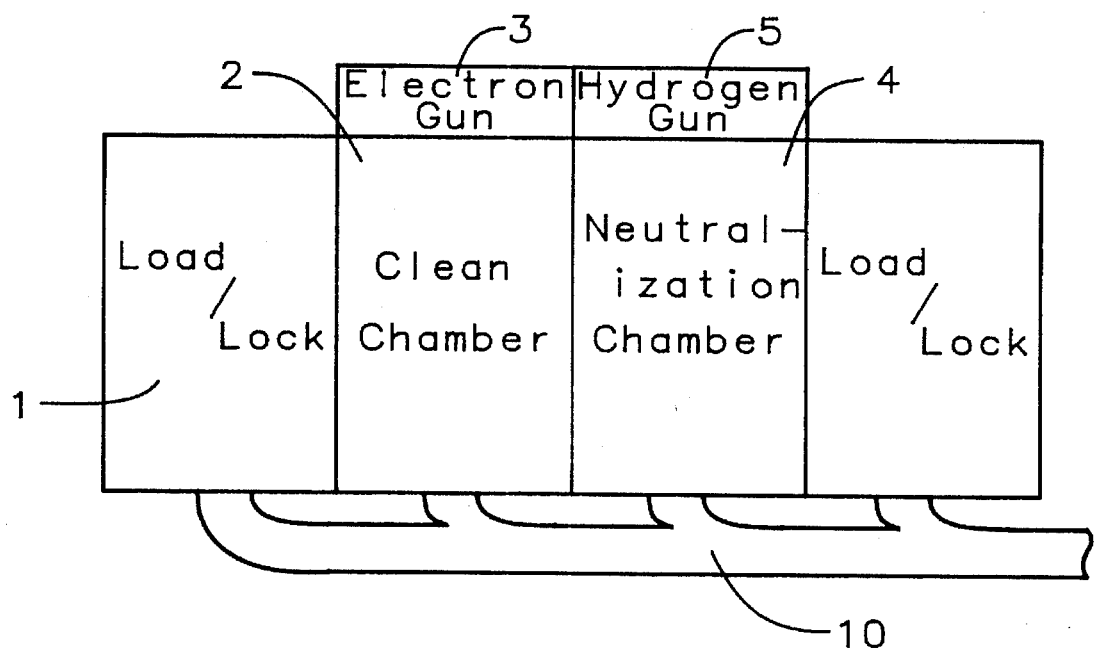

FIG. 1A illustrates one configuration of the cleaning device of the present invention. The wafer to be cleaned enters the device through the load/lock chamber 1 from which it is loaded into the clean chamber 2. All chambers are maintained under vacuum, 10. The wafer inside the clean chamber is irradiated by electron flux; that is, short bursts of electrons from the electron gun 3 within the chamber. A scanning system, a focus system, and an acceleration system are all utilized by the electron gun to provide a moderate charging on both particles and the wafer surface.

The electron gun system is similar to the cathode-ray tube of a television set. The configuration of such a system is very popular and can be found in every electron microscope. There are various electron gun configurations. Some use thermoionic emission filaments of tungsten (W) or lanthanum hexaboride (LAB6). In some electron gun configurations, the electrons come from a field emission (FE) tip. Typically, the electron current intensity for these three kinds of electron sources can be estimated as:

W<LaB6<FE 1<10<1000

Figure 2:
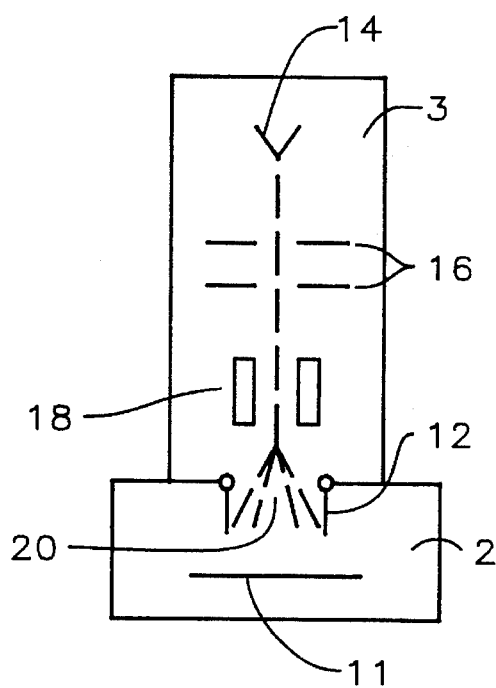

FIG. 2 illustrates an electron gun configuration. The wafer 11 is shown within the clean chamber 2. The electron gun 3 is separated from the clean chamber by a door 12 which is closed during wafer transfer (load/unload). The electron gun chamber 3 is maintained under a high vacuum while the clean chamber 2 is maintained under a lower vacuum. The source of electrons 14 is a filament or field emission tip. The electrons are usually extracted and accelerated to an energy of between about 5 to 30 KeV. The focus system is composed of one or several electromagnetic lenses. The focus and acceleration system is denoted by 16. The scanning system is composed of a scanning coil controlled by X-Y scanning generation circuits 18. The electrons are spread uniformly 20 over the entire wafer by this system.

The tremendous electric repulsive forces generated between the particles and the wafer surface caused by the irradiation of the wafer by electrons will release the particles from the wafer surface. These "untrapped" particles will be pumped out of the clean chamber by the vacuum present.

After the particles have been removed in the clean chamber, the wafer is transferred to the neutralization chamber 4. In this chamber, the entire wafer is neutralized to prevent the wafer from attracting particles again. If the upper layer on the wafer is a conductor, then a simple subsequent ground is enough to neutralize the wafer. The wafer holder and the wafer clamp should be conductors and grounded to neutralize the wafer.

Figure 3:
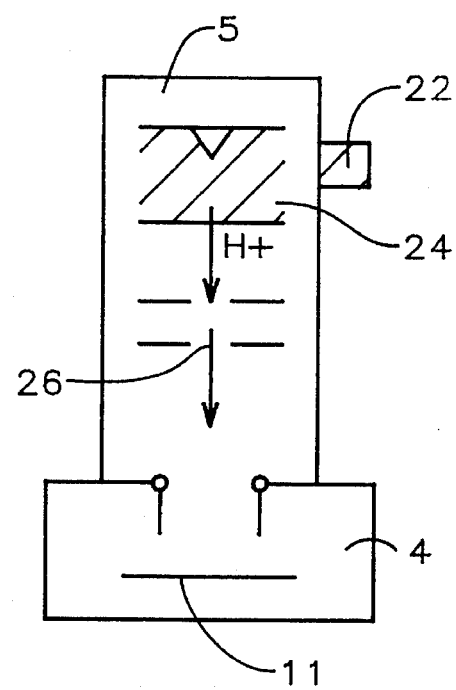

If the upper layer of the wafer is a dielectric layer, a hydrogen ion flux is implemented to neutralize the wafer. The configuration of the hydrogen gun is very similar to an ion source in a commercial ion implantor. The ions can be extracted, accelerated, and irradiated on the whole wafer through a scanning system in the same manner as in an implantor. FIG. 3 illustrates neutralization chamber 4 and hydrogen gun chamber 5. The wafer 11 is loaded into the neutralization chamber 4. Hydrogen gas is released from 22 into the chamber 5. The chamber is filled with a plasma 24 to ionize the hydrogen gas. Hydrogen ions 26 are accelerated and irradiated onto the wafer 11.

Figure 1B:
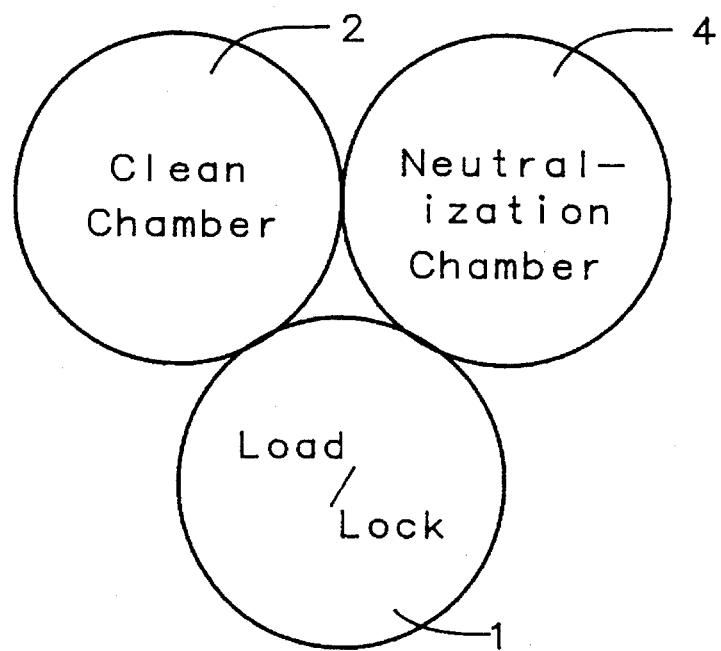

Finally, the wafer again enters the load/lock chamber 6 and is removed from the cleaning device. FIG. 1B illustrates a second possible configuration of the cleaning device. In this configuration, there is one load/lock chamber 1 which handles all transfers. The electron gun and hydrogen gun are not shown, but are within the clean 2 and neutralization 4 chambers, respectively, as in FIG. 1A. This configuration is also connected to the vacuum pump (not shown).

The cleaning device of this invention can be set up independent of any process chamber to remove particles. It is best to combine this cleaning device in front of all process chambers so that the wafer will be as clean as possible before each process.

The following Examples are given to show the important features of the invention and to aid in the understanding thereof and variations may be made by one skilled in the art without departing from the spirit and scope of the invention.

EXAMPLES

The cleaning device and process of the present invention should be used before and after film formation, after film etching, and before and after any thermal process. Film formation includes such processes as oxidation, such as field oxidation; chemical vapor deposition (CVD), such as borophosphosilicate glass (BPSG) or tetraethoxysilane (TEOS); physical vapor deposition (PVD), such as metal sputtering; coating, such as spin-on-glass or photoresist; and implantation. Film etching includes dry and wet etching, and photoresist development and removal. Thermal processing includes implant activation, furnace or rapid thermal annealing (RTA).

The device and process of the invention may be used to replace the wet cleaning of the prior art such as RCA clean (typically, $NH_4OH+H_2O_2$, then $HCl+H_2O_2$, followed by de-ionized water rinse), hydrofluoric acid, de-ionized water, hydrogen sulfate and hydrogen peroxide, ammonium hydroxide and hydrogen peroxide, chromium (III) oxide, and phosphoric acid. Alternatively, the process and device of the present invention may be used after conventional wet clean before film formation, film etching, or thermal processing. Particles remain on the surface of the wafer even after wet clean of the prior art because of physical adhesion of the particles caused by van der Waal's forces.

Figure 4:
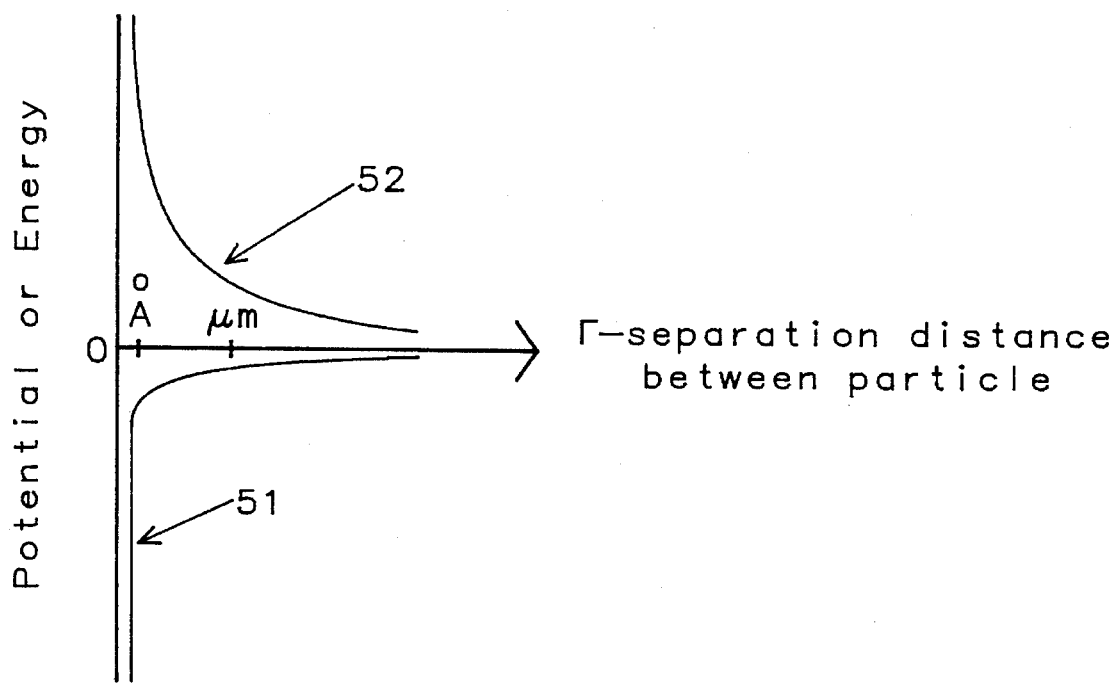

The magnitude of van der Waal's forces can be estimated using dipole-dipole interaction. The dipole moments are induced between neutral atoms or particles. The van der Waal's interaction energy varies as the minus sixth power of the separation of the two particles ($r^{-6}$) as shown by 51 in FIG. 4. This can be estimated from the melting point of inert gas: 84 K for argon and 117 K for krypton. A particle with a size of about 0.5 microns will be composed of about: $V \times D = (0.5 \times 10^{-4} \text{ cm})^3 \times (5 \times 10^{22} \text{ atoms/cm}^3) = 6.25 \times 10^9$ atoms, where V and D are the volume and density of common particles, respectively. Then, the binding energy for inert gas atoms is about: $kT = 1.38 \times 10^{-16}$ erg/K $\times 100$ K $= 1.38 \times 10^{-14}$ erg where k is Boltzmann's constant and T is Kelvin temperature. Therefore, the van der Waal's interaction energy between a particle with a size of about 0.5 microns and the silicon wafer can be estimated to be about the order of $(6.25 \times 10^9) \times (1.38 \times 10^{-14} \text{ ergs}) = 8.6 \times 10^{-5}$ ergs.

The electrostatic field comes from the charge-charge interaction. The electric energy varies as the inverse of the separation of the two particles ($r^{-1}$) as shown by 52 in FIG. 4. A particle on a silicon wafer surface said particle having the size of about 0.5 microns and charged with q statcoulombs will show an expelling energy of about:

$q^2$ statcoulomb$^2/(1 \times 10^{-4}$ cm$) = q^2 \times 10^4$ ergs

When this energy is larger than the van der Waal's force, the particle will be expelled immediately. This means, $q^2 \times 10^4$ ergs $> 8.6 \times 10^{-5}$ ergs and the critical q should be more than $9.3 \times 10^{-5}$ statcoulombs, i.e. $[9.3 \times 10^{-5}/(3 \times 10^9)]$ coulomb/$1.6 \times 10^{-19}$ coulomb/electron $= 2 \times 10^5$ electrons.

Typically, the electron gun can provide much more than 1 mA electron beam, i.e., $1 \times 10^{-3}$ coulomb per second or about $6.25 \times 10^{15}$ electrons per second. The electron flux density will be about $3.5 \times 10^{13}$ electrons/sec/cm$^2$ on a six inch wafer. The particle with the size of about 0.5 microns will be charged to the critical magnitude in seconds. Therefore, it is very easy to clean the wafer with a high throughput.

While the invention has been particularly shown and described with reference to the preferred embodiments thereof, it will be understood by those skilled in the art that various changes in form and details may be made without departing from the spirit and scope of the invention.

What is claimed is:

1. A cleaning device to remove particles from the conductive layer surface of a semiconductor wafer comprising:

a clean chamber comprising means to irradiate said semiconductor wafer by electron flux whereby an electric repulsive force between said semiconductor wafer surface and said particles will remove said particles from said wafer surface into the ambient within said clean chamber;

a neutralization chamber comprising means to apply a ground to said semiconductor wafer whereby said semiconductor wafer is neutralized to prevent new particles from being attracted to the cleaned surface of said semiconductor wafer; and a vacuum system connected to said clean chamber and said neutralization chamber wherein said vacuum system will carry away said particles removed from said semiconductor wafer surface into the ambient within said clean chamber.

2. The device of claim 1 wherein said electron flux is generated by an electron gun within said clean chamber.

3. The device of claim 1 wherein said clean chamber further comprises an electron gun chamber for generating said electron flux comprising:

an electron gun;

a focus system;

an acceleration system; and a scanning system.

4. The device of claim 1 wherein said electron flux is comprised of short bursts of electrons and wherein said electron flux causes moderate charging to take place on both said particles and said semiconductor wafer surface causing said electric repulsive force.

5. A method of removing particles from the conductive layer surface of a semiconductor wafer within a clean chamber comprising:

irradiating said semiconductor wafer by electron flux whereby an electric repulsive force between said semiconductor wafer surface and said particles will remove said particles from said semiconductor wafer surface into the ambient within said clean chamber; and neutralizing said wafer by applying a ground to said wafer to prevent new particles from being attracted to the cleaned surface of said semiconductor wafer.

6. The method of claim 5 wherein said semiconductor wafer is cleaned under vacuum and wherein a vacuum pump carries away said particles removed from the surface of said wafer into the ambient within said clean chamber.

7. The method of claim 5 wherein said electron flux is generated by an electron gun.

8. The method of claim 5 wherein said electron flux is comprised of short bursts-of electrons and wherein said electron flux causes moderate charging to take place on both said particles and said semiconductor wafer surface causing said electric repulsive force.

9. A cleaning device to remove particles from the dielectric layer surface of a semiconductor wafer comprising:

a clean chamber comprising means to irradiate said semiconductor wafer by electron flux comprising short bursts of electrons wherein said electron flux causes moderate charging to take place on both said particles and said semiconductor wafer surface causing an electric repulsive force whereby said electric repulsive force will remove said particles from said wafer surface;

a neutralization chamber comprising means to irradiate said semiconductor wafer with a hydrogen ion flux whereby said semiconductor wafer is neutralized to prevent new particles from being attracted to the cleaned surface of said semiconductor wafer; and a vacuum system connected to said clean chamber and said neutralization chamber wherein said vacuum system will carry away said particles removed from said semiconductor wafer surface within said clean chamber.

10. The device of claim 9 wherein said electron flux is generated by an electron gun within said clean chamber.

11. The device of claim 9 wherein said clean chamber further comprises an electron gun chamber for generating said electron flux comprising:

an electron gun;

a focus system;

an acceleration system; and a scanning system.

12. The device of claim 9 wherein said hydrogen ion flux is generated by a hydrogen gun within said neutralization chamber.

13. A cleaning device to remove particles from the dielectric layer surface of a semiconductor wafer comprising:

irradiating said semiconductor wafer by electron flux comprising short bursts of electrons wherein said electron flux causes moderate charging to take place on both said particles and said semiconductor wafer surface causing an electric repulsive force between said semiconductor wafer surface and said particles whereby said particles will be removed from said semiconductor wafer surface; and neutralizing said wafer by irradiation with a hydrogen ion flux to prevent new particles from being attracted to the cleaned surface of said semiconductor wafer.

14. The method of claim 13 wherein said semiconductor wafer is cleaned under vacuum and wherein a vacuum pump carries away said particles removed from the surface of said wafer.

15. The method of claim 13 wherein said electron flux is generated by an electron gun.

16. The method of claim 13 wherein said hydrogen ion flux is generated by a hydrogen gun.

* * * * *